United States Patent
Wakioka

(10) Patent No.: US 11,011,484 B2
(45) Date of Patent: May 18, 2021

(54) SEMICONDUCTOR DEVICE HAVING FIRST AND SECOND TERMINALS

(71) Applicant: KIOXIA CORPORATION, Tokyo (JP)

(72) Inventor: Hiroyuki Wakioka, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/799,024

(22) Filed: Feb. 24, 2020

(65) Prior Publication Data

US 2021/0074657 A1 Mar. 11, 2021

(30) Foreign Application Priority Data

Sep. 6, 2019 (JP) .............................. JP2019-162625

(51) Int. Cl.
*H01L 23/00* (2006.01)
*H01L 25/065* (2006.01)

(52) U.S. Cl.
CPC .............. *H01L 24/05* (2013.01); *H01L 24/13* (2013.01); *H01L 25/0657* (2013.01); *H01L 2224/0401* (2013.01); *H01L 2224/05557* (2013.01); *H01L 2224/05647* (2013.01); *H01L 2224/05655* (2013.01); *H01L 2224/05684* (2013.01); *H01L 2225/06513* (2013.01); *H01L 2924/0135* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,330,272 B2 * | 12/2012 | Haba | ...................... | H01L 24/81 257/737 |
| 8,405,207 B1 * | 3/2013 | Crisp | ..................... | G11C 5/066 257/724 |
| 8,853,558 B2 * | 10/2014 | Gupta | ..................... | H01L 24/14 174/260 |
| 2007/0018313 A1 * | 1/2007 | Gomyo | ................. | H01L 21/568 257/723 |

(Continued)

FOREIGN PATENT DOCUMENTS

| | | |
|---|---|---|
| JP | 2009-248156 A | 10/2009 |
| JP | 5320165 B2 | 10/2013 |

*Primary Examiner* — Mamadou L Diallo
(74) *Attorney, Agent, or Firm* — Foley & Lardner LLP

(57) ABSTRACT

A semiconductor device includes a first substrate and a second substrate that is stacked on a first surface of the first substrate in a stacking direction and includes a second surface facing the first surface. A plurality of first terminals is provided on the first surface of the first substrate. A plurality of second terminals is provided on the second surface of the second substrate. A plurality of metallic portions is respectively provided between the plurality of first terminals and the plurality of second terminals. In a cross-section substantially perpendicular to the stacking direction, at least one of (i) each of the plurality of first terminals or (ii) each of the plurality of second terminals (a) includes a recessed portion in a first direction toward an adjacent first terminal or second terminal or (b) includes a projecting portion in a second direction intersecting with the first direction.

13 Claims, 15 Drawing Sheets

(56) References Cited

U.S. PATENT DOCUMENTS

| | | | |
|---|---|---|---|
| 2007/0045869 A1* | 3/2007 | Ho | H01L 24/81 257/780 |
| 2007/0220744 A1* | 9/2007 | Kitaoka | H05K 3/107 29/846 |
| 2009/0014896 A1 | 1/2009 | Hsu | |
| 2009/0102064 A1* | 4/2009 | Sawada | H01L 24/12 257/778 |
| 2012/0025365 A1* | 2/2012 | Haba | H01L 24/17 257/692 |
| 2013/0099371 A1 | 4/2013 | Cheng et al. | |
| 2013/0100626 A1* | 4/2013 | Inoue | H01L 23/49811 361/783 |
| 2015/0153627 A1 | 6/2015 | Kimura | |
| 2017/0263821 A1 | 9/2017 | In et al. | |
| 2018/0033779 A1* | 2/2018 | Park | H01L 23/49827 |
| 2021/0013156 A1* | 1/2021 | Kim | H01L 25/0657 |

\* cited by examiner

SEMICONDUCTOR DEVICE HAVING FIRST AND SECOND TERMINALS

CROSS-REFERENCE TO RELATED APPLICATION(S)

This application claims the benefit of and priority to Japanese Patent Application No. 2019-162625, filed Sep. 6, 2019, the entire contents of which are incorporated herein by reference.

FIELD

Embodiments described herein relate generally to a semiconductor device.

BACKGROUND

In semiconductor devices, a system in package (SiP) structure in which a plurality of semiconductor chips is stacked in layers within one package has been developed to attain miniaturization and high functionality of each semiconductor device. In the SiP structure, interconnecting, by flip chip, a plurality of semiconductor chips stacked in layers is performed by interconnecting respective electrodes of a plurality of semiconductor chips adjoining one above the other with, for example, solder bumps.

When solder bumps are reflowed by the semiconductor chips being pressed, the solder bumps may be crushed between the electrodes and then may be protruded from between the electrodes. When the direction in which solder is protruded is a direction toward an adjoining different electrode, solder bumps may come into contact with the adjoining different electrode and thus cause short-circuit defect. On the other hand, making the diameter of an electrode or a solder bump smaller to prevent or reduce short-circuit defect may cause open-circuit defect with respect to an electrode originally intended for connection.

DETAILED DESCRIPTION

Figure 1:
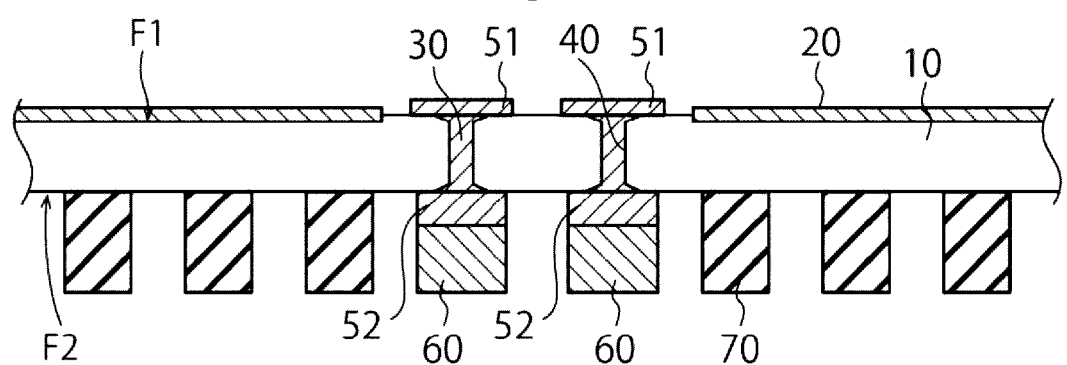
FIG. 1 is a sectional view illustrating an example of a method for manufacturing a semiconductor device according to a first embodiment.

Embodiments provide a semiconductor device which is capable of preventing or reducing short-circuit defect which may occur in adjoining electrodes between a plurality of semiconductor chips stacked in layers.

In general, according to one embodiment, a semiconductor device may include a first substrate and a second substrate. The second substrate may be stacked on a first surface of the first substrate and include a second surface facing the first surface. A plurality of first terminals may be provided on the first surface of the first substrate. A plurality of second terminals may be provided on the second surface of the second substrate. A plurality of metallic portions may be respectively provided between the plurality of first terminals and the plurality of second terminals. In a cross-section approximately perpendicular to a stacking direction in which the second substrate is stacked on the first substrate, each of the plurality of first terminals or each of the plurality of second terminals may include a recessed portion in a first direction toward a different first or second terminal most closely adjacent thereto or include a projecting portion in a second direction intersecting with the first direction.

Hereinafter, embodiments according to the present disclosure will be described with reference to the drawings. The following embodiments are not intended to limit the present disclosure. The drawings are merely schematic or conceptual ones, and, for example, ratios of respective components are not necessarily identical to the actual ones. In the specification and drawings, elements similar to those described in a preceding description part with reference to the precedent drawings are assigned the respective same reference characters, and the detailed description thereof is omitted as needed.

First Embodiment

Figure 2:
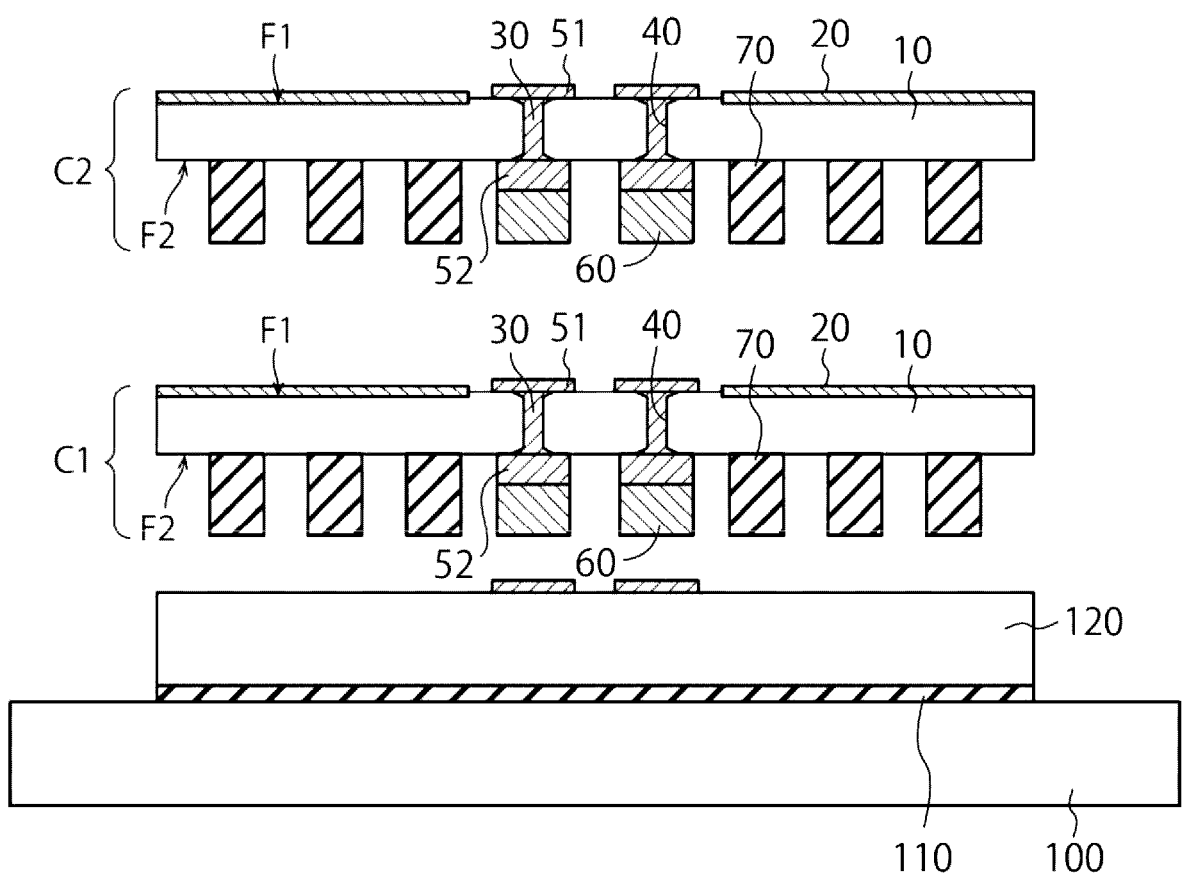
FIG. 2 is a sectional view illustrating an example of the method for manufacturing a semiconductor device, continuing from FIG. 1.
Figure 3:
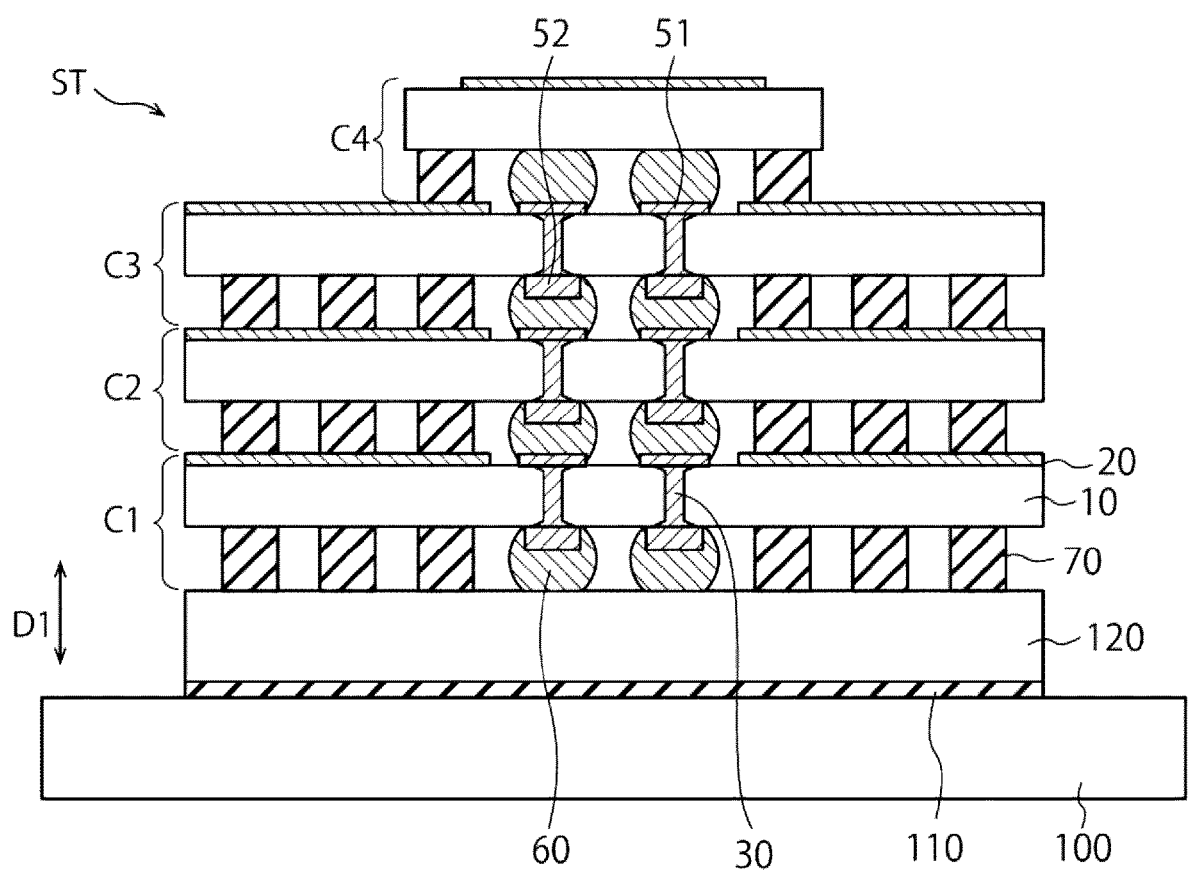
FIG. 3 is a sectional view illustrating an example of the method for manufacturing a semiconductor device, continuing from FIG. 2.

FIG. 1 to FIG. 3 are sectional views illustrating a method for manufacturing a semiconductor device according to a first embodiment. First, a semiconductor element 20 is formed on a first surface F1 of a semiconductor substrate 10. The semiconductor substrate 10 may be, for example, a silicon substrate. The semiconductor element 20 may be, for example, a three-dimensional memory cell array, in which a plurality of memory cells is three-dimensionally arranged, and a complementary metal-oxide semiconductor (CMOS) circuit, which controls the memory cell array. In other words, the semiconductor device may be a semiconductor chip in a NAND-type flash memory. Furthermore, the semiconductor element 20 may be a different large-scale integration (LSI). Moreover, the semiconductor element 20 may be formed on a second surface F2 of the semiconductor substrate 10.

Next, penetration electrodes 30, such as through-silicon vias (TSVs), are formed in the semiconductor substrate 10. Each penetration electrode 30 may be formed by embedding a metallic material into a through-hole 40, which is provided between the first surface F1 and the second surface F2 opposite thereto and penetrates the semiconductor substrate 10. The penetration electrode 30 may be made from, for example, a low-resistance metal, such as copper, nickel, or tungsten.

Bump electrodes 51, each of which serves a first terminal connected to the penetration electrode 30, are formed on the first surface F1. Each bump electrode 51 may be made from, for example, a low-resistance metal, such as copper, nickel, or tungsten.

Bump electrodes 52, each of which serves a second terminal connected to the penetration electrode 30, are formed on the second surface F2. Each bump electrode 52 may be made from, for example, a low-resistance metal, such as copper, nickel, or tungsten. Metal bumps 60, each of which serves as a metallic portion, are formed on the bump electrodes 52. Each metal bump 60 may be configured with a material lower in melting point than the bump electrodes 51 and 52. In some embodiments, each metal bump 60 may be configured with a material lower in melting point than at least one of the bump electrode 51 or 52. The metal bump 60 may be made from, for example, a low-melting-point metal such as solder (e.g., tin). The metal bump 60 may be configured with a material other than solder as long as the material is an electrically conductive material lower in melting point than the bump electrodes 51 and 52 (or lower in melting point than at least one of the bump electrode 51 or 52). The width of each of the bump electrode 52 and the metal bump 60 may be, for example, 5 µm to 50 µm inclusive. The distance between adjacent bump electrodes 52 may be, for example, 10 µm to 100 µm inclusive.

Adhesives 70 are formed on the second surface F2 of the semiconductor substrate 10. The adhesives 70 may be made from, for example, a resin, such as epoxy, phenol, or acrylic, or a mixed resin including these resins.

Semiconductor chips formed as described above are interconnected by flip chip. Furthermore, a plurality of semiconductor wafers may be stacked in layers directly in a wafer state and then be subjected to dicing. Alternatively, semiconductor wafers may be divided into individual chip-like pieces and, then, the chip-like pieces may be stacked in layers. The following description is made on the premise that semiconductor wafers are subjected to dicing into semiconductor chips and, then, the semiconductor chips are stacked in layers.

Next, as illustrated in FIG. 2, A wiring substrate 120 is bonded on the lead frame 100 with an adhesive 110. Then, a plurality of semiconductor chips C1, C2, . . . , are stacked in layers on the wiring substrate 120. Thus, a plurality of semiconductor chips C1, C2, . . . , is interconnected by flip chip. Here, the wiring substrate 120 may be treated as a "first substrate", and the semiconductor chip C1 may be treated as a "second substrate". Moreover, instead of the wiring substrate 120, a semiconductor chip in which the penetration electrode 30 is not formed may be treated as a "first substrate", and a different plurality of semiconductor chips stacked on that semiconductor chip may be treated as a "second substrate". When a semiconductor chip is treated as a first substrate, the semiconductor chip treated as a first substrate may be a semiconductor chip which has a circuit configuration approximately equivalent to a different semiconductor chip treated as a second substrate stacked on that semiconductor chip and differs only in that the penetration electrode 30 is not formed.

FIG. 3 is a sectional view illustrating a configuration obtained as a result of stacking a plurality of semiconductor chips C1 to C4 in layers on the wiring substrate 120. The semiconductor chips C1 to C3 are, for example, NAND memory chips, and the semiconductor chip C4 is, for example, a controller chip. The plurality of semiconductor chips C1 to C4, which is adjacent to each other in a stacking direction (i.e., a direction D1), is bonded to each other with adhesives 70, thus configuring a stacked body ST. The semiconductor chips C1 to C4 may be electrically interconnected via the bump electrodes 51 and 52, the metal bumps 60, and the penetration electrodes 30. Furthermore, while, in the present embodiment, four semiconductor chips C1 to C4 are stacked in layers, the number of semiconductor chips to be stacked in layers may be three or less or may be five or more.

Here, planar shapes of the bump electrodes 51 and 52 and the metal bumps 60 are described.

Figure 4:
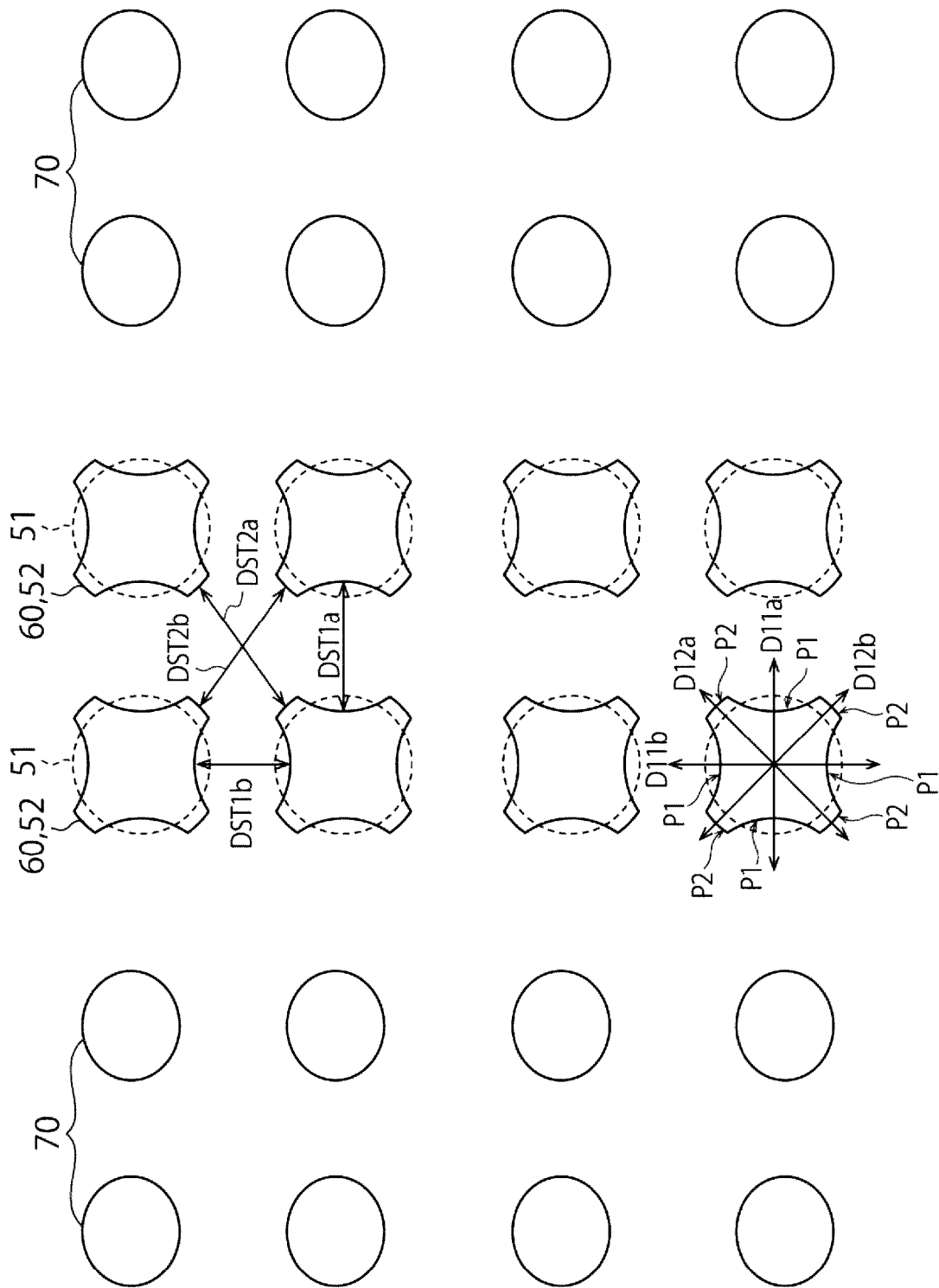
FIG. 4 is a schematic plan view of the semiconductor chip illustrated in FIG. 1 as viewed from a second surface thereof.

FIG. 4 is a schematic plan view of the semiconductor chip illustrated in FIG. 1 as viewed from the second surface F2. Furthermore, the outlines of the bump electrodes 51 are also illustrated for descriptive purposes. The bump electrodes 52 and the metal bumps 60 may be processed at the same time with use of a lithography technique and an etching technique when the semiconductor chip illustrated in FIG. 1 is formed. Accordingly, the bump electrodes 52 and the metal bumps 60 may have almost the same shape in planar shape.

In the present embodiment, the bump electrodes 52 and the metal bumps 60 may be arranged in two columns approximately at regular intervals, and the adhesives 70 may be arranged on both sides of the two columns. The bump electrodes 52 and the metal bumps 60 may be arranged in a matrix shape in three or more columns.

In the present embodiment, each bump electrode and each metal bump 60 have recessed portions P1 and projecting portions P2 in planar shape. Each recessed portion P1 is provided in a direction D11$a$ or direction D11$b$, which is a first direction toward a different bump electrode 52 or different metal bump 60 most closely adjacent to the bump electrode 52 or metal bump 60. In other words, the recessed portions P1 are provided in four directions toward the nearest different bump electrodes 52 or different metal bumps 60 adjacent in four directions.

On the other hand, each projecting portion P2 is provided between adjacent recessed portions P1 and is provided in a second direction D12$a$ or direction D12$b$, which intersects with the direction D11$a$ or direction D11$b$. The projecting portions P2 are also provided in four directions, and project in the second direction D12$a$ and direction D12$b$, which intersect with the direction D11$a$ and direction D11$b$ while being inclined at an angle of about 45 degrees relative thereto.

When the bump electrode 52 and the metal bump 60 do not include the recessed portions P1 and the projecting portions P2 and are approximately circular as with the bump electrode 51, each of distances DST1$a$ and DST1$b$ between two adjacent bump electrodes 52 in each of the direction D11$a$ and direction D11$b$ is relatively short. On the other hand, each of distances DST2$a$ and DST2$b$ between two adjacent bump electrodes 52 in each of the direction D12$a$ and direction D12$b$ is relatively long (e.g., longer than distances DST1$a$ and DST1$b$). In this case, when, in the chip stacking and reflow process for the metal bump 60, solder may be protruded in the direction D11a and direction D11b, since each of the distances DST1a and DST1b between two adjacent metal bumps 60 is relatively short, the metal bumps 60 are likely to come into contact with each other and, thus, may cause short-circuit defect. On the other hand, when solder is protruded in the direction D12a and direction D12b, since each of the distances DST2a and DST2b between two adjacent metal bumps 60 is relatively long, the metal bumps 60 are unlikely to come into contact with each other.

Therefore, in the present embodiment, each bump electrode 52 and each metal bump 60 include, in planar shape, the recessed portions P1 in the direction D11a and direction D11b and the projecting portions P2 in the direction D12a and direction D12b. With regard to the direction D11a and direction D11b, two bump electrodes 52 or metal bumps 60 most closely adjacent to each other face each other at the respective recessed portions P1 thereof. Accordingly, the distance DST1a or DST1b between two bump electrodes 52 or metal bumps 60 most closely adjacent to each other can be widened. With this, in the chip stacking and reflow process for the metal bump 60, even if solder is protruded in the direction D11a and direction D11b, the metal bumps 60 become unlikely to come into contact with each other.

Figure 5:
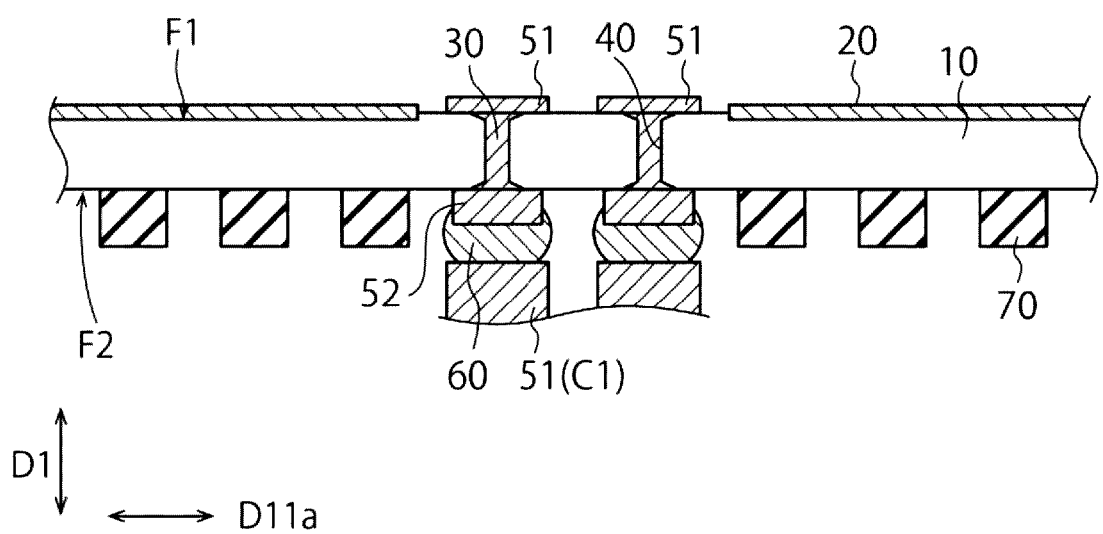
FIG. 5 is a sectional view of a semiconductor chip obtained when metal bumps are reflowed between bump electrodes.

Moreover, when solder is protruded in the direction D11a and direction D11b, solder may also be protruded to the side surface of the bump electrodes 52 to some extent in the direction perpendicular to the drawing sheet of FIG. 4 (in other words, a direction D1 illustrated in FIG. 5). For example, FIG. 5 is a sectional view of a semiconductor chip obtained when the metal bump 60 is reflowed between the bump electrode 52 and the bump electrode 51. As illustrated in FIG. 5, when the metal bump 60 is protruded in the direction D11a and direction D11b, solder can spread in the direction D1 along the side surface of the bump electrode 52. This enables reducing solder from being protruded in the direction D11a and direction D11b. As a result, the metal bumps 60 can become further unlikely to come into contact with each other.

Moreover, owing to the projecting portions P2 being provided in the direction D12a and direction D12b, in the reflow process for the metal bumps 60, melted solder can flow along the projecting portion P2. Accordingly, the projecting portion P2 is able to guide the direction in which solder is protruded (in other words, outflows) to the direction D12a and direction D12b. The direction D12a and direction D12b are directions in which the distances DST2a and DST2b between metal bumps 60 are large. Therefore, even when being protruded in the direction D12a and direction D12b, the metal bump 60 can be unlikely to come into contact with a different metal bump 60.

In this way, the bump electrode 52 according to the present embodiment can control the direction in which solder is protruded in the reflow process for the metal bumps 60 and cause solder to be protruded in the direction D12a and direction D12b, in which the distance between the metal bump 60 and a different metal bump 60 is large. Alternatively, the bump electrode 52 can guide the metal bump 60 in the direction D1 along the side surface of the bump electrode 52. This enables preventing or reducing short-circuit defect occurring between adjacent metal bumps 60.

Next, the reflow process performed when semiconductor chips C1 to C4 are stacked in layers from the state illustrated in FIG. 2 to the state illustrated in FIG. 3 is described.

Figure 6:
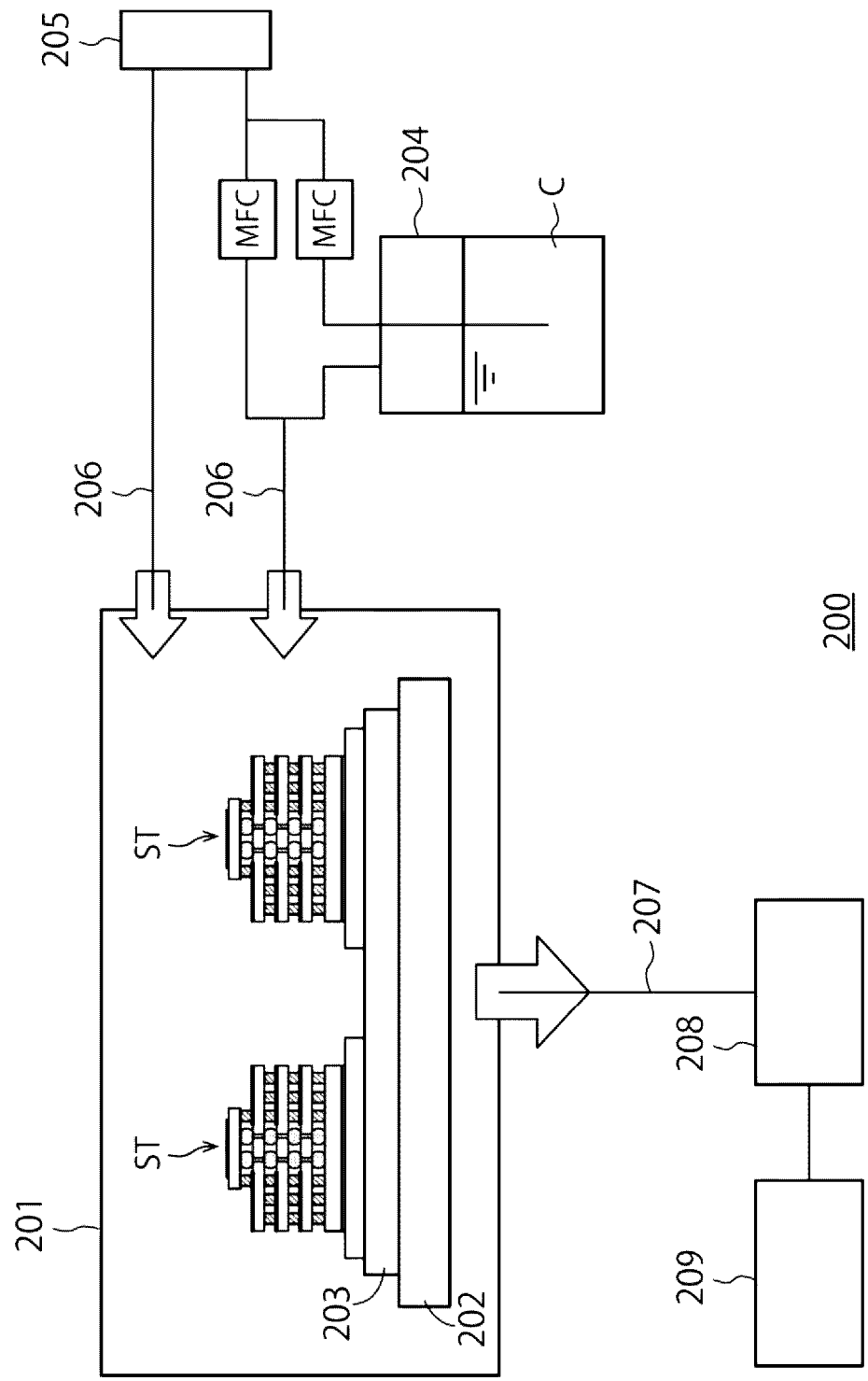
FIG. 6 is a block diagram illustrating a configuration example of a heat treatment apparatus for use in a reflow process.

FIG. 6 is a block diagram illustrating a configuration example of a heat treatment apparatus 200 for use in the reflow process. The heat treatment apparatus 200 includes a chamber 201, a heater 202, a stage 203, a chemical tank 204, an inactive gas supply unit 205, pipes 206 and 207, mass flow controllers MFC, a vacuum pump 208, and an abatement apparatus 209.

The chamber 201 contains the heater 202 and the stage 203. The stage 203 may allow a plurality of stacked bodies ST carried in the chamber 201 to be placed thereon. The heater 202 is able to heat the plurality of stacked bodies ST. This enables reflowing metal bumps 60 between semiconductor chips inside the chamber 201.

The chemical tank 204 is capable of containing a chemical C and is connected to the chamber 201 and the inactive gas supply unit 205 via the pipe 206. The chemical C may include, as a reducing agent, for example, formic acid (HCOOH in chemical composition). Formic acid may be used as, for example, a reducing agent for reducing oxidized solder (e.g., tin oxide (SnO or $SnO_2$)). The chemical C may be vaporized inside the chemical tank 204 and may then be introduced into the chamber 201 via the pipe 206 as a reducing agent for reducing tin oxide (SnO or $SnO_2$).

The inactive gas supply unit 205 may supply inactive gas into the chemical tank 204 or the chamber 201 via the pipe 206. The inactive gas may be, for example, nitrogen gas or noble gas. In the chemical tank 204, the inactive gas may be used to vaporize the chemical C. Moreover, the inactive gas may also be used to adjust the concentration of reducing gas and may be used to perform cleaning of the inside of the chamber 201. The following description is made on the premise that the chemical C is a formic acid solution and the reducing gas contains formic acid gas as a major component.

The vacuum pump 208 is connected to the chamber 201 via the pipe 207, and is able to depressurize the inside of the chamber 201 and control the air pressure inside the chamber 201. The abatement apparatus 209 may render gas exhausted by the vacuum pump 208 harmless.

The stacked body ST may be heat-treated by the heat treatment apparatus 200 configured as described above.

Figure 7A:
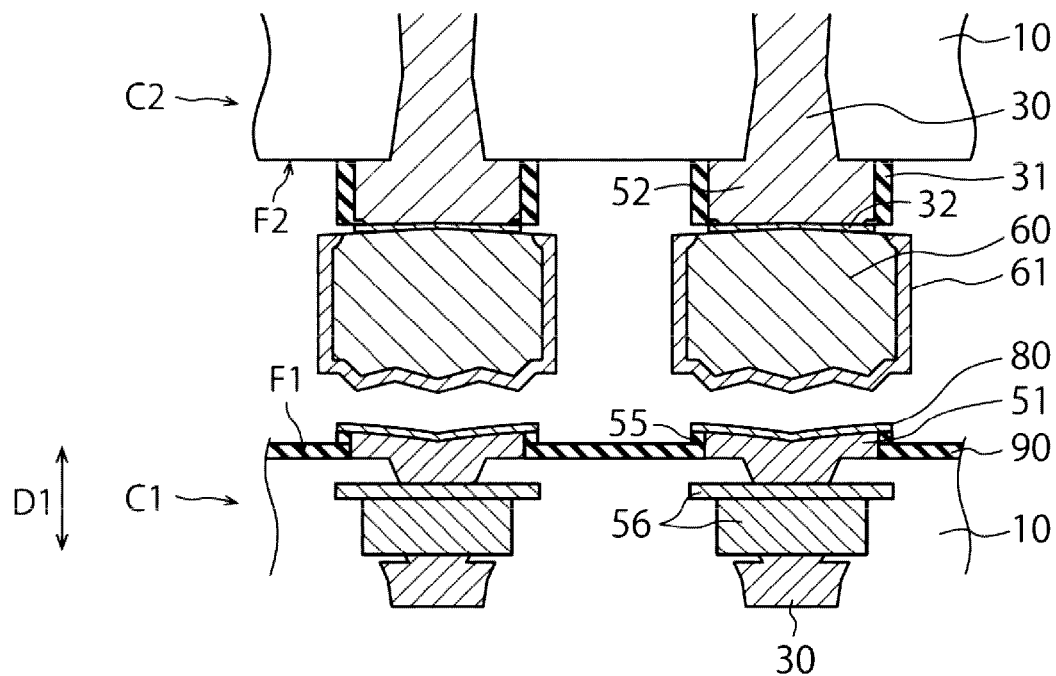
FIG. 7A and FIG. 7B are sectional views illustrating an example of a reflow process for metal bumps.
Figure 7B:
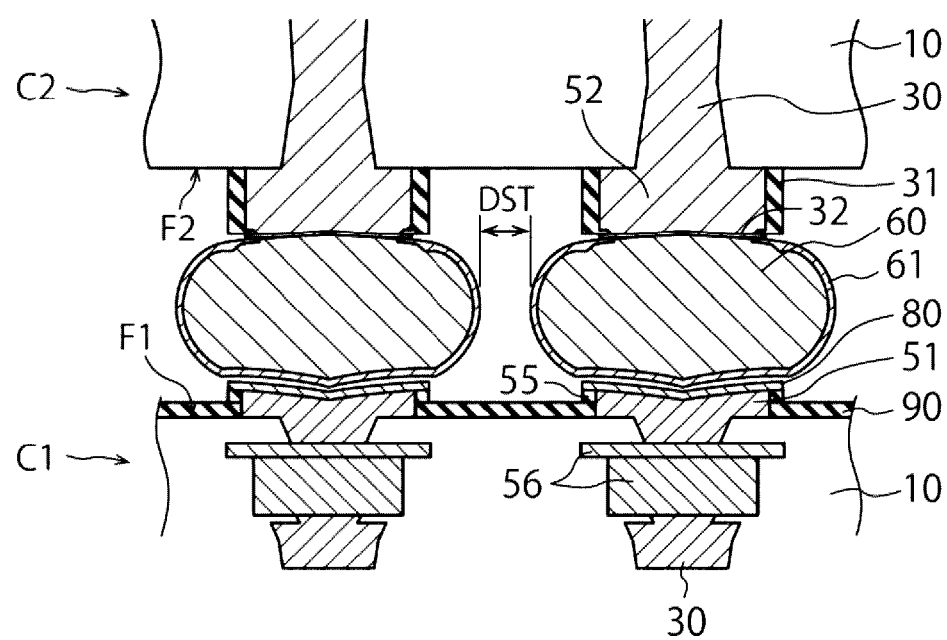
Figure 8:
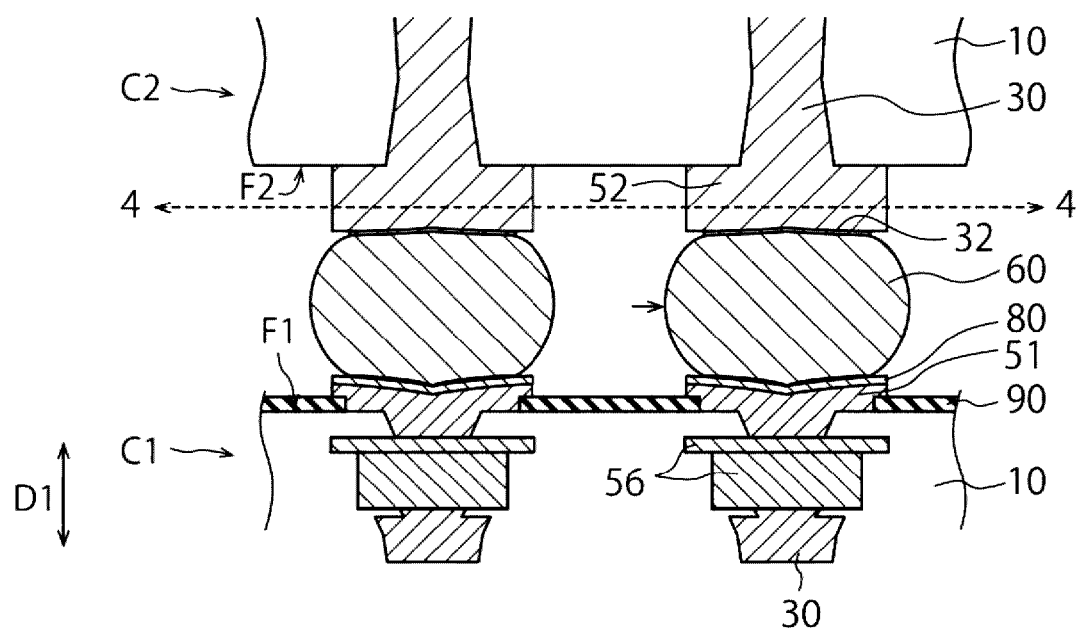
FIG. 8 is a sectional view illustrating an example of the reflow process for metal bumps, continuing from FIG. 7B.

FIGS. 7A and 7B and FIG. 8 are sectional views illustrating an example of a reflow process for the metal bumps 60. FIGS. 7A and 7B and FIG. 8 illustrate a behavior in which a semiconductor chip C2 as a second semiconductor chip is stacked on the first surface F1 of a semiconductor chip C1 as a first semiconductor chip.

First, as illustrated in FIG. 7A, the reflow process may cause the first surface F1 of the semiconductor chip C1 as a first semiconductor chip and the second surface F2 of the semiconductor chip C2 as a second semiconductor chip to face each other, and then may perform position adjustment of the bump electrode 51 on the side of the semiconductor chip C1 and the bump electrode 52 or the metal bump 60 on the side of the semiconductor chip C2 in such a way as to enable the bump electrode 51 and the bump electrode 52 or the metal bump 60 to come into contact with each other. Furthermore, at this time, the planar shapes of the bump electrodes 51 and 52 and the metal bump 60 as viewed from the second surface F2 of the semiconductor chip C2 are previously formed as illustrated in FIG. 4.

In the semiconductor chip C1, an oxide film 55 is formed on the side surface of the bump electrode 51. The bump electrode 51 may be made from, for example, nickel. The oxide film 55 may be a natural oxide film, which is, for example, a nickel oxide film, of the bump electrode 51. Gold plating 80 is formed on the surface of the bump electrode 51. A polyimide film 90 is provided on the first surface F1 around the bump electrode 51, and may be used for electrical insulation between adjacent bump electrodes 51. The penetration electrode 30 may be made from, for example, nickel. The penetration electrode 30 may be electrically connected to the bump electrode 51 via a conductive body 56.

On the other hand, in the semiconductor chip C2, an oxide film 61 is formed around the metal bump 60. The oxide film 61 may be a natural oxide film of the metal bump 60, and may be configured with, for example, a tin oxide (e.g., SnO or $SnO_2$) film. For example, a nickel oxide film 31 is formed on the side surface of the bump electrode 52. A copper film 32 is provided between the bump electrode 52 and the metal bump 60, and may be used to appropriately interconnect the bump electrode 52 and the metal bump 60.

While heating the semiconductor chips C1 and C2, the semiconductor chips C1 and C2 are caused to come close to each other in the direction D1 and are pressed against each other. At this time, the temperature of each of the semiconductor chips C1 and C2 may be lower than the melting point of the metal bump 60. For example, the temperature of each of the semiconductor chips C1 and C2 may be about 150° C. This may cause temporary fixing of the bump electrode 51 and the metal bump 60 to each other. Temporary fixing refers to interconnecting the bump electrode 51 and the metal bump 60 to the extent that the semiconductor chips C1 and C2 do not become detached from each other when the semiconductor chips C1 and C2 are carried in the heat treatment apparatus 200. Accordingly, temporary fixing may be connection weaker than the connection of the semiconductor chips C1 and C2 obtained after the reflow process. Moreover, temporary fixing only needs to be physically interconnecting the bump electrode 51 and the metal bumps 60, and does not need to be electrical connection. Temporary fixing of the bump electrode 51 and the metal bump 60 to each other may be implemented by, for example, while heating the metal bump 60 to less than the melting point thereof with use of a pulse heater heating-type bonder, pushing the semiconductor chips C1 and C2 to each other to press the bump electrode 51 and a solder bump against each other. Moreover, temporary fixing may be implemented by bonding the semiconductor chip C1 and the semiconductor chip C2 to each other with a photosensitive adhesive or a non-conductive adhesive, which is not illustrated.

In temporary fixing, as illustrated in FIG. 7B, the metal bump 60 becomes crushed to some extent between the semiconductor chip C1 and the semiconductor chip C2 to be deformed into an approximately elliptical shape. Accordingly, the distance (in other words, a gap) DST between adjacent metal bumps 60 becomes small. At this time, the bump electrode 51 and the metal bump 60 are connected to each other via the oxide film 61, and do not yet need to be electrically connected to each other.

At this time, the metal bump 60 is crushed to some extent, and, as described above with reference to FIG. 4 and FIG. 5, the metal bump 60 may be protruded in the direction D12$a$ and direction D12$b$, in which the distance between the bump electrode 52 or metal bump 60 and a different bump electrode 52 or different metal bump 60 is larger (than in the direction D11$a$ and direction D11$b$), or the metal bump 60 may be protruded to some extent in the direction D1 along the side surface of the bump electrode 52. With this, the distance (in other words, a gap) DST between adjacent metal bumps 60 can be less likely to become small. This can lead to preventing or reducing short-circuit defect occurring between the metal bumps 60 in a subsequent reflow process.

In this way, the semiconductor chips C1 and C2 can be stacked in such a way as to cause the bump electrode 51 and the metal bump 60 to come into contact with each other and to be temporarily fixed to each other. Similarly, other semiconductor chips C3 and C4 can be also temporarily fixed to each other on the semiconductor chips C1 and C2. The wiring substrate 120 and the semiconductor chips C1 to C4 stacked in layers are hereinafter referred to as a "stacked body ST".

Next, to reflow the metal bump 60, the reflow process carries the stacked body ST subjected to temporary fixing into the chamber 201 of the heat treatment apparatus 200 illustrated in FIG. 6. The stacked body ST is placed on the stage 203.

After the stacked body ST is carried into the chamber 201, the inside of the chamber 201 may be depressurized, and the heater 202 may raise the temperature of the stage 203. The heat treatment apparatus 200 may introduce formic acid gas from the chemical tank 204 to the chamber 201, thus reducing and removing the oxide film (e.g., tin oxide) 61. Additionally, the heat treatment apparatus 200 may heat-treat the stacked body ST to a temperature higher than or equal to the melting point of the metal bump 60. With this, as illustrated in FIG. 8, the metal bump 60 can be reflowed and thus can be electrically connected to the bump electrode 51 of the semiconductor chip C1.

Here, in the reflow process, as described above with reference to FIG. 4 and FIG. 5, the metal bump 60 is guided in the direction D12$a$ and direction D12$b$, or the metal bump 60 flows in the direction D1 along the side surface of the bump electrode 52. In the direction D12$a$ and direction D12$b$, the distance between the bump electrode 52 and another bump electrode 52 is larger than that in the direction D11$a$ and direction D11$b$. Similarly, in the direction D12$a$ and direction D12$b$, the distance between the metal bump 60 and another metal bump 60 is larger than that in the direction D11$a$ and direction D11$b$. This enables preventing or reducing short-circuit defect occurring between adjacent metal bumps 60.

Figure 9:
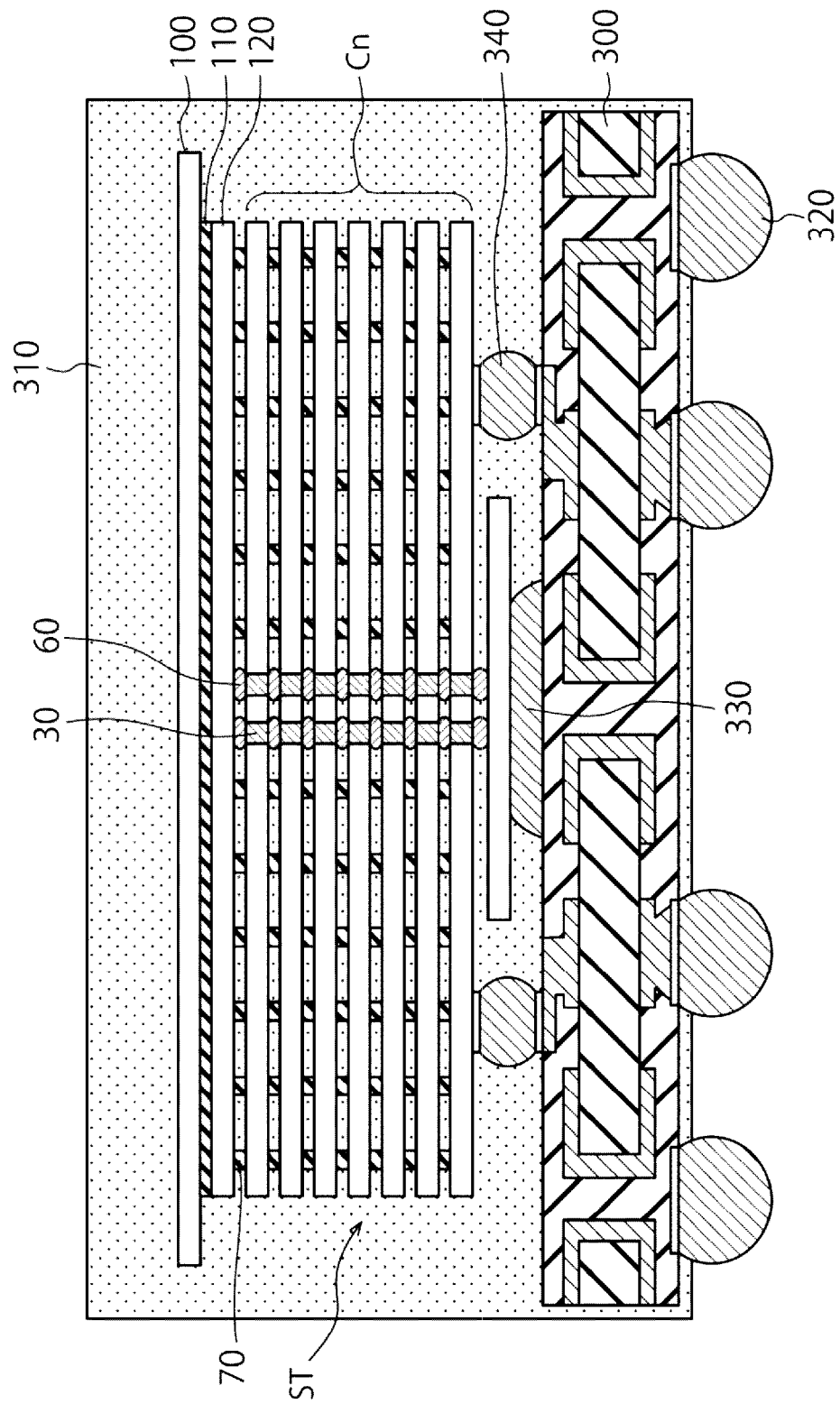
FIG. 9 is a sectional view illustrating an example of a semiconductor package.

Next, the heater 202 may lower the temperature of the stage 203, and the air pressure of the inside of the chamber 201 may be brought close to atmospheric pressure. After that, the stacked body ST may be carried out of the chamber 201 and may be assembled as a semiconductor package. For example, FIG. 9 is a sectional view illustrating an example of the semiconductor package. The stacked body ST may be bonded onto a mounting substrate 300 with a thermosetting resin 330, and the stacked body ST and the mounting substrate 300 may be interconnected via, for example, wire bonding (not illustrated) or bump electrodes 340. After that, the stacked body ST on the mounting substrate 300 may be sealed with a resin 310, and external connection terminals 320 may be formed on the undersurface of the mounting substrate 300. This may complete a semiconductor package as a system in package (SiP). Furthermore, in FIG. 9, semiconductor chips Cn (n being an integer) in the stacked body ST may be larger in number than those in the stacked body ST illustrated in FIG. 3.

In the semiconductor device formed via the above-described process, as illustrated in FIG. 8, the semiconductor chip C1 and the semiconductor chip C2 may be stacked in such a way as to cause the first surface F1 and the second surface F2 to face each other. The bump electrode 51 provided on the first surface F1 of the semiconductor chip C1 and the bump electrode 52 provided on the second surface F2 of the semiconductor chip C2 may be electrically interconnected via the metal bump 60. The metal bump 60 provided between the bump electrode 51 and the bump electrode 52 may be reflowed and, therefore, can have a shape different from the shape illustrated in FIG. 4. However, the bump electrode 52 can have the same shape as the shape illustrated in FIG. 4. Accordingly, in a cross-section approximately perpendicular to the stacking direction (i.e., the direction D1) of the semiconductor chips C1 and C2 (in other words, a cross-section taken along line 4-4 illustrated in FIG. 8), the bump electrode 52 includes recessed portions P1 in the direction D11a and direction D11b and projecting portions P2 in the direction D12a and direction D12b illustrated in FIG. 4. This enables controlling the direction in which the metal bump 60 is protruded and preventing or reducing short-circuit defect occurring between adjacent metal bumps 60 in the above-mentioned temporary fixing and reflow process.

Figure 10:
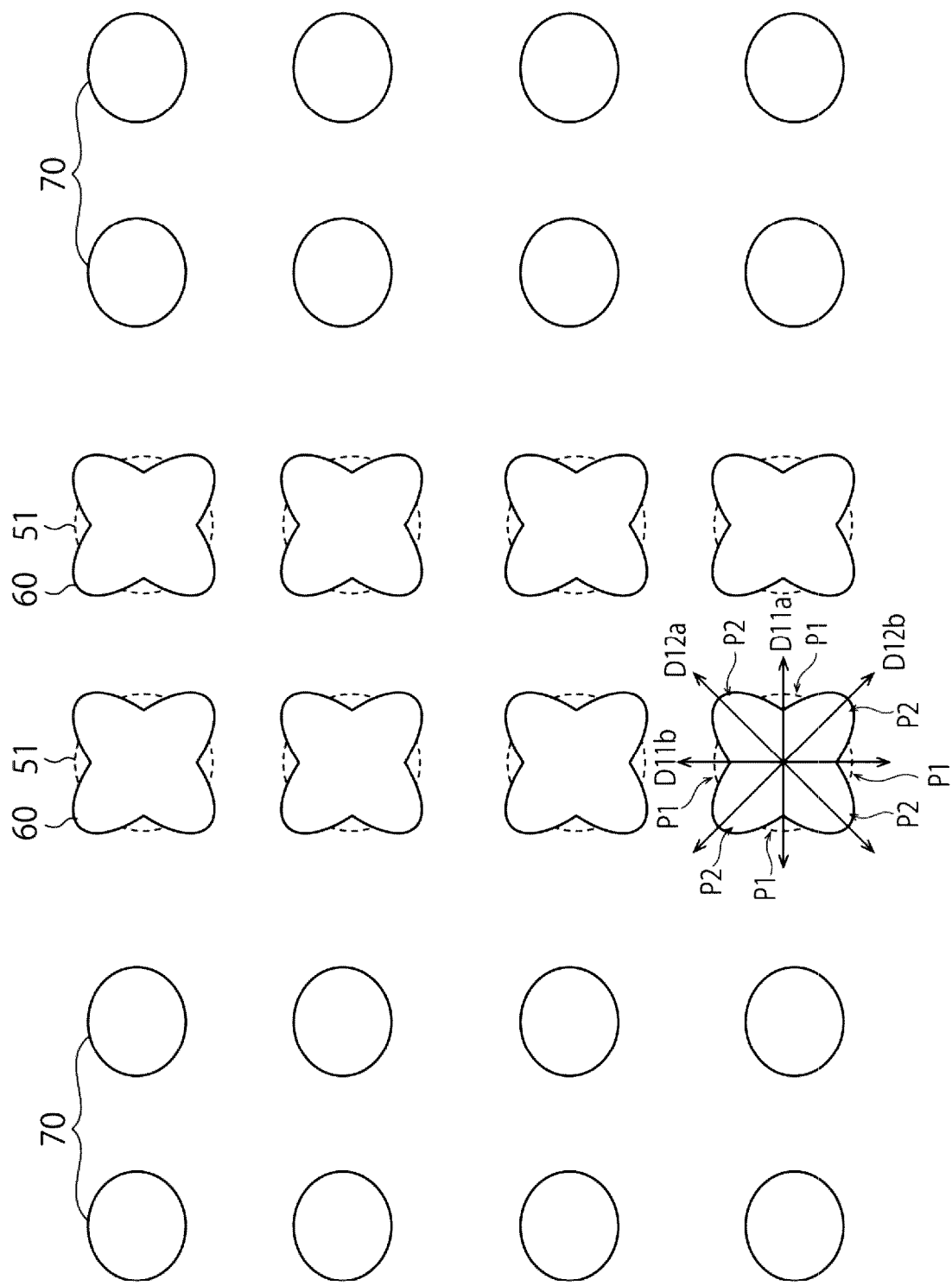
FIG. 10 is a schematic plan view of a semiconductor chip subjected to reflow as viewed from the second surface thereof.

Moreover, in the reflow process, the direction of flow of the metal bump 60 can be controlled according to the shape of the bump electrode 52. For example, FIG. 10 is a schematic plan view of the semiconductor chip subjected to reflow as viewed from the second surface F2. In the reflow process, the metal bump 60 may be guided (i.e., protruded) in the direction D12a and direction D12b to a more extent than in the direction D11a and direction D11b, as mentioned above. Accordingly, in a cross-section approximately perpendicular to the direction D1, the widths of the metal bump 60 in the direction D12a and direction D12b may be larger than the widths thereof in the direction D11a and direction D11b. In this way, in the temporary fixing and reflow process, the bump electrode 52 enables controlling the direction in which the metal bump 60 is protruded according to the distance between adjacent metal bumps 60 and preventing or reducing short-circuit defect occurring between adjacent metal bumps 60.

Modification Example 1

Figure 11:
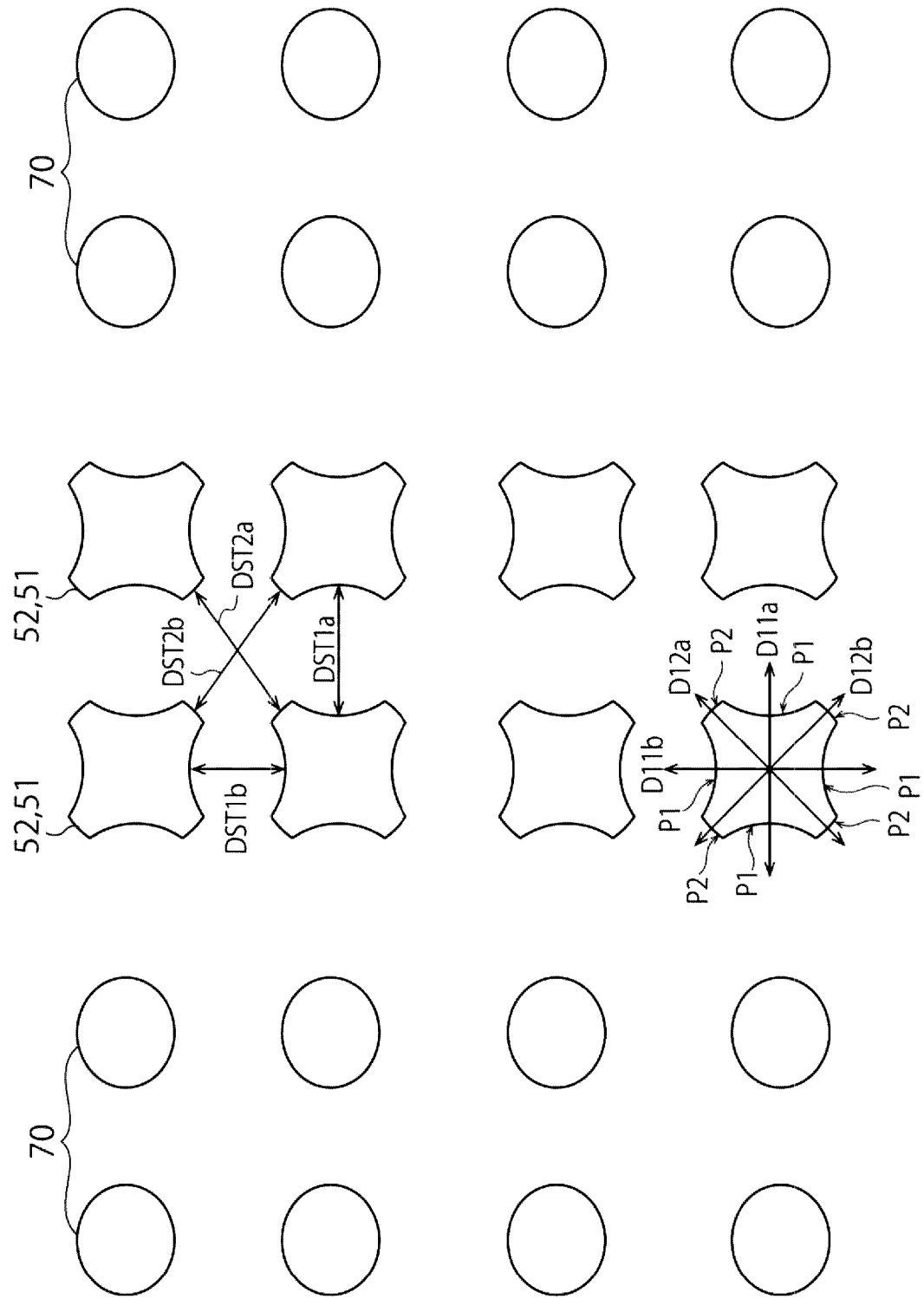
FIG. 11 is a schematic plan view of a semiconductor chip according to a modification example 1 of the first embodiment.

FIG. 11 is a schematic plan view of a semiconductor chip according to a modification example 1 of the first embodiment. In the modification example 1, the bump electrode 51 also has the same shape as the bump electrodes 52. More specifically, each bump electrode 51 includes, in planar shape, recessed portions P1 and projecting portions P2. The recessed portions P1 are provided in four directions toward the nearest different bump electrodes 51. Each projecting portion P2 is provided between adjacent recessed portions P1 and is provided in a second direction D12a or direction D12b, which intersects with the direction D11a or direction D11b.

As with the bump electrodes 52, the bump electrode 51 includes recessed portions P1 and projecting portions P2. With this, in the reflow process, the metal bump 60 interposed between the bump electrode 51 and the bump electrode 52 may become further likely to be guided in the direction D12a and direction D12b. Moreover, when being protruded in the direction D11a and direction D11b, the metal bump 60 may flow in the direction D1 not only along the side surface of the bump electrode 52 but also along the side surface of the bump electrode 51. This further can decrease the amount of solder which is protruded in the direction D11a and direction D11b. As a result, the metal bumps 60 can become further unlikely to come into contact with each other.

Modification Example 2

Figure 12:
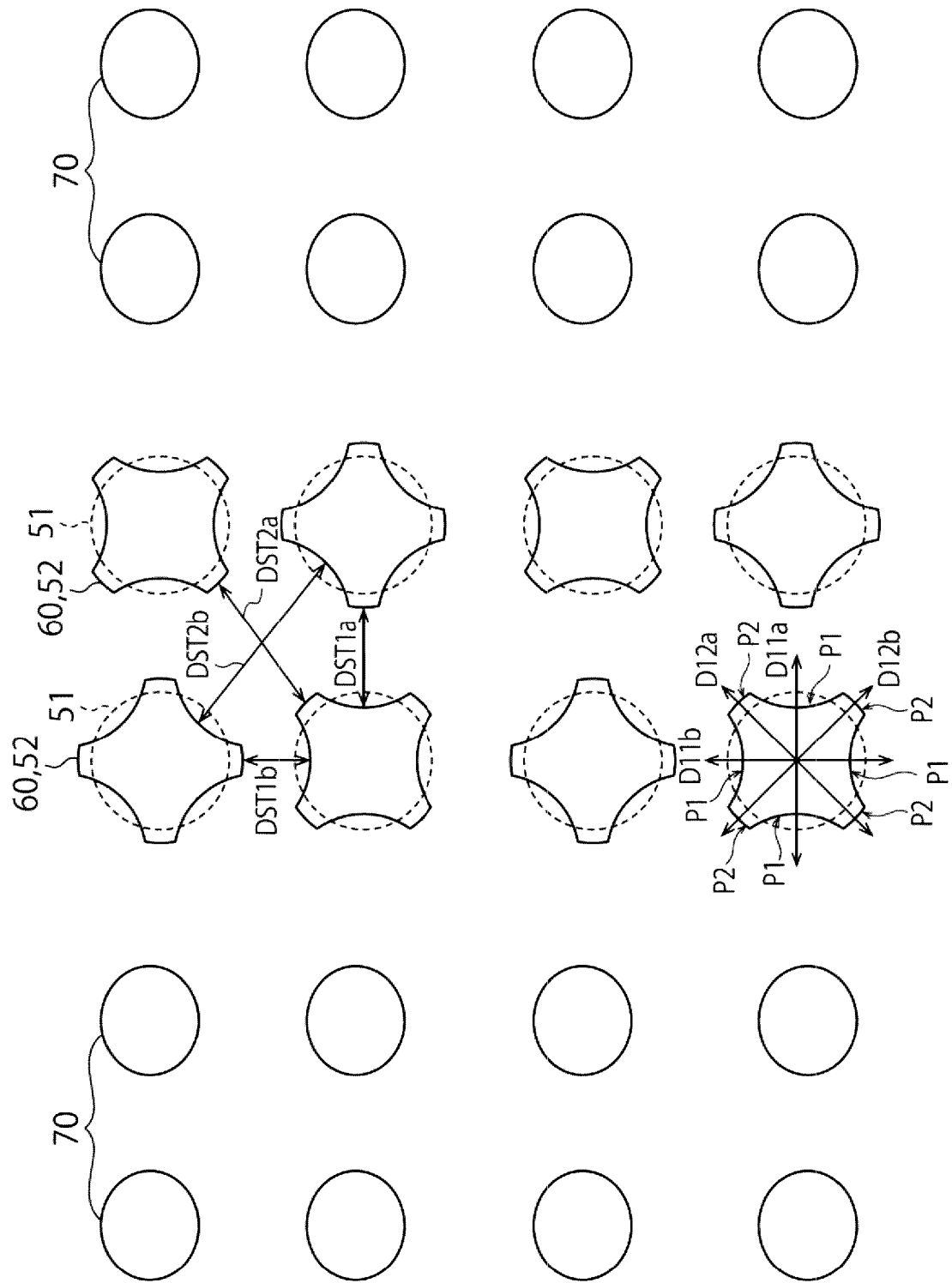
FIG. 12 is a schematic plan view of a semiconductor chip according to a modification example 2 of the first embodiment.

FIG. 12 is a schematic plan view of a semiconductor chip according to a modification example 2 of the first embodiment. In the modification example 2, the directions of the recessed portions P1 and the projecting portions P2 are rotated about 90 degrees between two bump electrodes 52 most closely adjacent to each other. In other words, a plurality of bump electrodes 52 may be arranged in such a way as to be alternately rotated every about 90 degrees. Accordingly, in a cross-section approximately perpendicular to the stacking direction D1, one of two bump electrodes 52 most closely adjacent to each other includes a recessed portion P1 toward the other thereof (i.e., in the direction D11a or direction D11b), and the other thereof includes a projecting portion P2 toward the one thereof (i.e., in the direction D11a or direction D11b). In other words, two bump electrodes 52 most closely adjacent to each other face each other at the recessed portion P1 and the projecting portion P2.

In this case, the distance DST1a or DST1b between two bump electrodes 52 most closely adjacent to each other can be kept large to some extent. Moreover, the direction of a projecting portion P2 of each bump electrode 52 for guiding the metal bump 60 is toward a recessed portion P1 of a different bump electrode 52 most closely adjacent to each bump electrode 52. Accordingly, the semiconductor device according to the modification example 2 also enables preventing or reducing short-circuit defect occurring between metal bumps 60.

The modification example 2 may be combined with the modification example 1. In other words, the bump electrode 51 may also be formed into the same shape as that of the bump electrode 52. The bump electrodes 51 may be arranged in such a way as to be alternately rotated every about 90 degrees, and two bump electrodes 51 most closely adjacent to each other may face each other at the recessed portion P1 and the projecting portion P2 thereof. This enables the modification example 2 to also attain the advantageous effect of the modification example 1.

Second Embodiment

Figure 13:
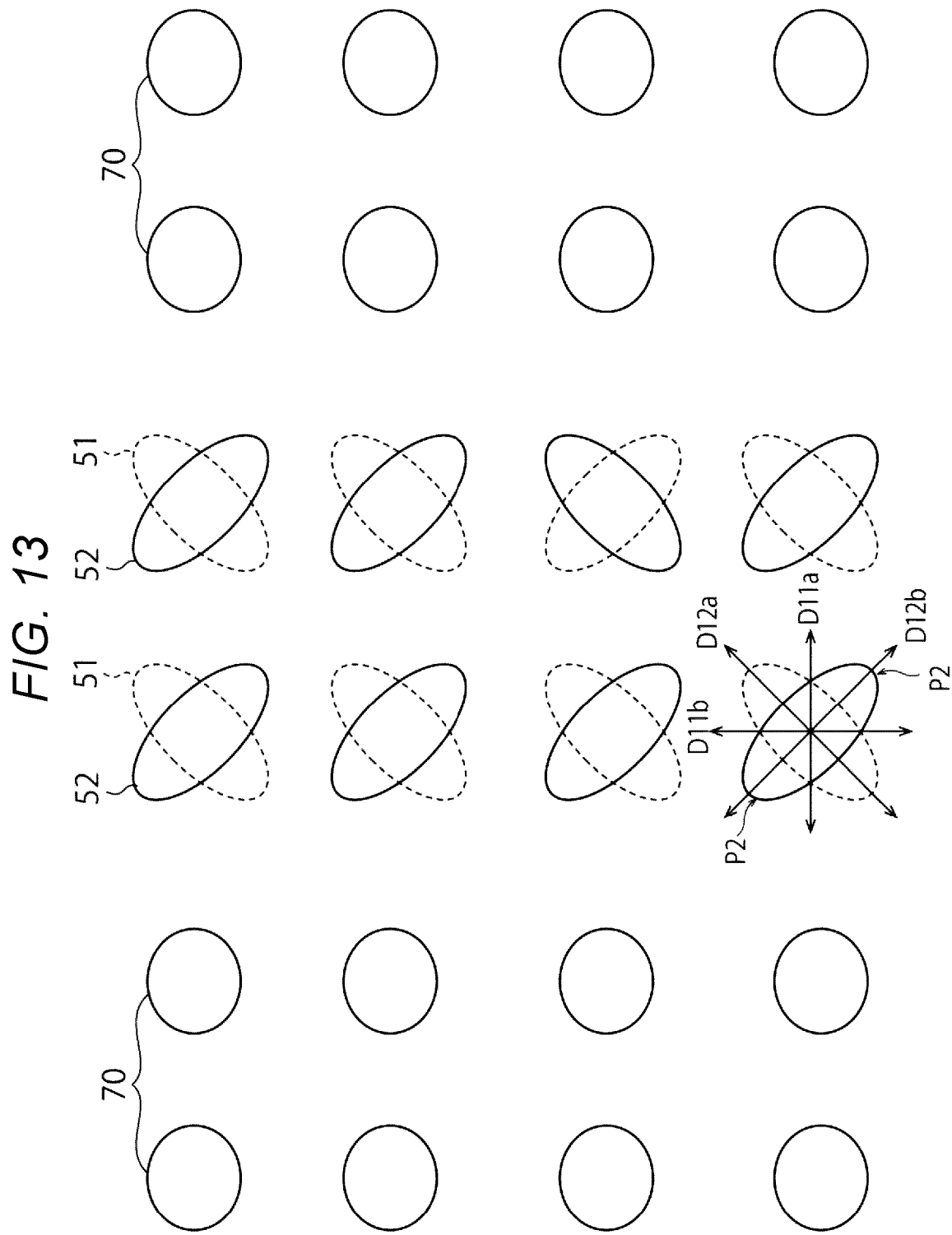
FIG. 13 is a schematic plan view of a semiconductor chip according to a second embodiment.

FIG. 13 is a schematic plan view illustrating a semiconductor chip according to a second embodiment. In the second embodiment, each of a plurality of bump electrodes 51 and a plurality of bump electrodes 52 is arranged in such a way as to have at least one of a major axis and a minor axis in directions inclined relative to an adjoining direction thereof (e.g., in oblique directions of about 45 degrees). For example, in a cross-section approximately perpendicular to the stacking direction D1, each of a plurality of bump electrodes 52 has the shape of an approximate ellipse having a major axis in the direction D12b and a minor axis in the direction D12a approximately perpendicular to the direction D12b. The major axis direction (or the minor axis direction) of each of the bump electrode 51 and the bump electrode 52 may also be said to be a direction inclined about 45 degrees relative to the array directions D11a and D11b of the bump electrodes 51 and 52.

With this, the major axis of each of the bump electrodes 51 and 52 functions in the same way as the projecting portion P2, thus guiding the metal bump 60 in the reflow process. Accordingly, the metal bump 60 is protruded in the major axis direction (i.e., the direction D12a or D12b) of the bump electrodes 51 and 52, and is not much protruded in the direction D11a or D11b of a different metal bump 60 most closely adjacent to each metal bump 60.

Moreover, in the second embodiment, as viewed from the stacking direction, the major axis of the bump electrode 51 and the major axis of the bump electrode 52 cross each other (i.e., are approximately orthogonal). More specifically, in a cross-section approximately perpendicular to the stacking direction, the bump electrode 52 has the shape of an approximate ellipse having a major axis in the direction D12b and having a minor axis in the direction D12a. The bump electrode 51 has the shape of an approximate ellipse having a minor axis in the direction D12b and having a major axis in the direction D12a. This causes the major axis of the bump electrode 52 to almost coincide in direction with the minor axis of the bump electrode 51. Therefore, in the reflow process, a melted metal bump 60 is protruded to some extent in the direction D1 along the side surface of the bump electrode 51. Moreover, the major axis of the bump electrode 51 almost coincides in direction with the minor axis of the bump electrode 52. Therefore, in the reflow process, a melted metal bump 60 is protruded to some extent in the direction D1 along the side surface of the bump electrode 52. Therefore, each metal bump 60 is guided in the direction D12a and direction D12b and is unlikely to be protruded in the direction of a different metal bump 60 most closely adjacent to each metal bump 60. As a result, short-circuit defect occurring between adjacent metal bumps 60 can be prevented or reduced. The second embodiment is able to attain an advantageous effect similar to that of the first embodiment.

Moreover, as viewed from the stacking direction, the overlapping area between the bump electrode 51 and the bump electrode 52 is relatively small. Therefore, the amount of protrusion itself of the metal bump 60 becomes small, so that short-circuit defect occurring between adjacent metal bumps 60 can be prevented or reduced.

Furthermore, in FIG. 13, the major axes and minor axes of the bump electrodes 51 and 52 may be interchanged. More specifically, the bump electrode 52 may have a major axis in the direction D12a, and the bump electrode 51 may have a major axis in the direction D12b. Moreover, each of the bump electrodes 51 and 52 may have, instead of the shape of an approximate ellipse, the shape of an approximate rectangle. In this case, the major axes and minor axes of the bump electrodes 51 and 52 only need to be replaced with the long sides and short sides of the respective rectangles.

Moreover, to maintain the distance between adjacent bump electrodes 51 or the distance between adjacent bump electrodes 52, it is favorable that all of the directions of major axes of the bump electrodes 51 are aligned along approximately the same direction. It is favorable that all of the directions of major axes of the bump electrodes 52 are also aligned along approximately the same direction.

Modification Example

Figure 14:
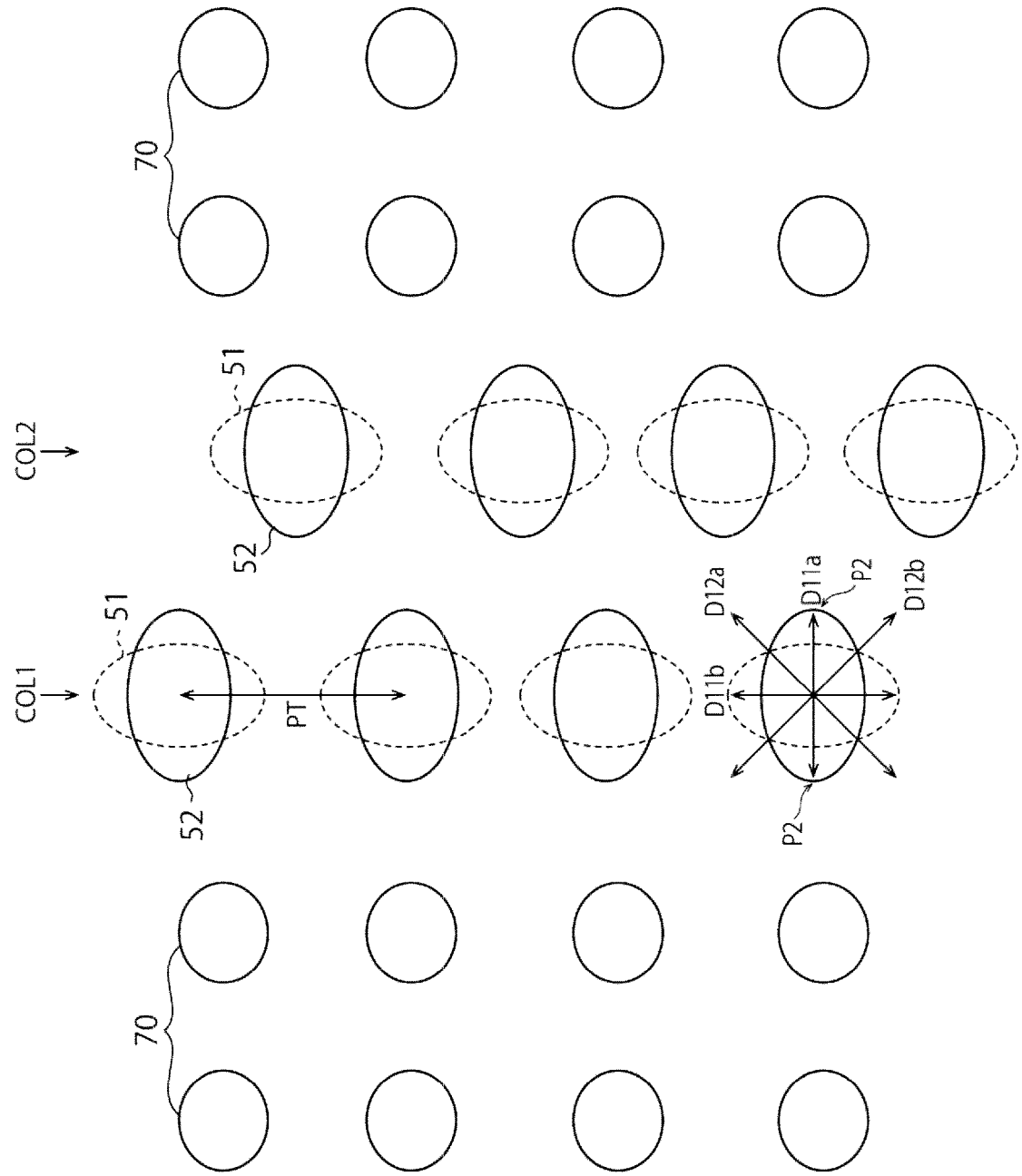
FIG. 14 is a schematic plan view of a semiconductor chip according to a modification example of the second embodiment.

FIG. 14 is a schematic plan view of a semiconductor chip according to a modification example of the second embodiment. In the present modification example, the bump electrodes 51 and 52 may be arrayed in a staggered arrangement. More specifically, bump columns (in other words, arrays) COL1 and COL2 arranged in the direction D11b of each of a plurality of bump electrodes 51 and a plurality of bump electrode 52 are adjacent to each other in the direction D11a and are out of alignment with each other by every half pitch in the direction D11b. One pitch PT is the distance between a plurality of bump electrodes 51 and between a plurality of bump electrodes 52 adjacent to each other in the direction D11b.

Moreover, each of the bump electrodes 51 and 52 has a major axis or a minor axis in the direction D11a or direction D11b. More specifically, one of the major axis direction or minor axis direction of the bump electrode 51 is the array direction D11b of bump electrodes 51, and the other of the major axis direction or minor axis direction of the bump electrode 52 is the array direction D11b of bump electrodes 52. For example, the bump electrode 51 has a major axis in the direction D11b and has a minor axis in the direction D11a. The bump electrode 52 has a major axis in the direction D11a and has a minor axis in the direction D11b. In the present modification example, in the adjoining direction D11a of the bump columns COL1 and COL2, bump electrodes 52 are not adjacent to each other. Accordingly, the bump electrode 52, which has a major axis in the direction D11a, thus can guide the metal bump 60 in the direction D11a in the reflow process. With this, even when being protruded in the direction D11a, each metal bump 60 can be unlikely to come into contact with another metal bump 60 adjacent to each metal bump 60.

In this way, according to the present modification example, even when a plurality of bump electrodes 51 and a plurality of bump electrodes 52 are arrayed in a staggered arrangement, short-circuit defect occurring between metal bumps 60 can be prevented or reduced.

Third Embodiment

Figure 15:
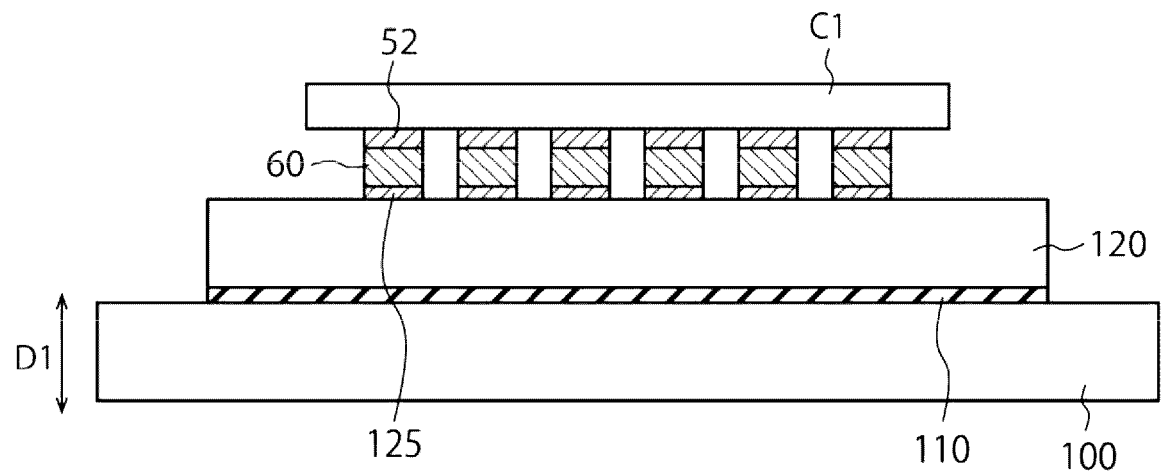
FIG. 15 is a schematic sectional view of a semiconductor chip according to a third embodiment.
Figure 16:
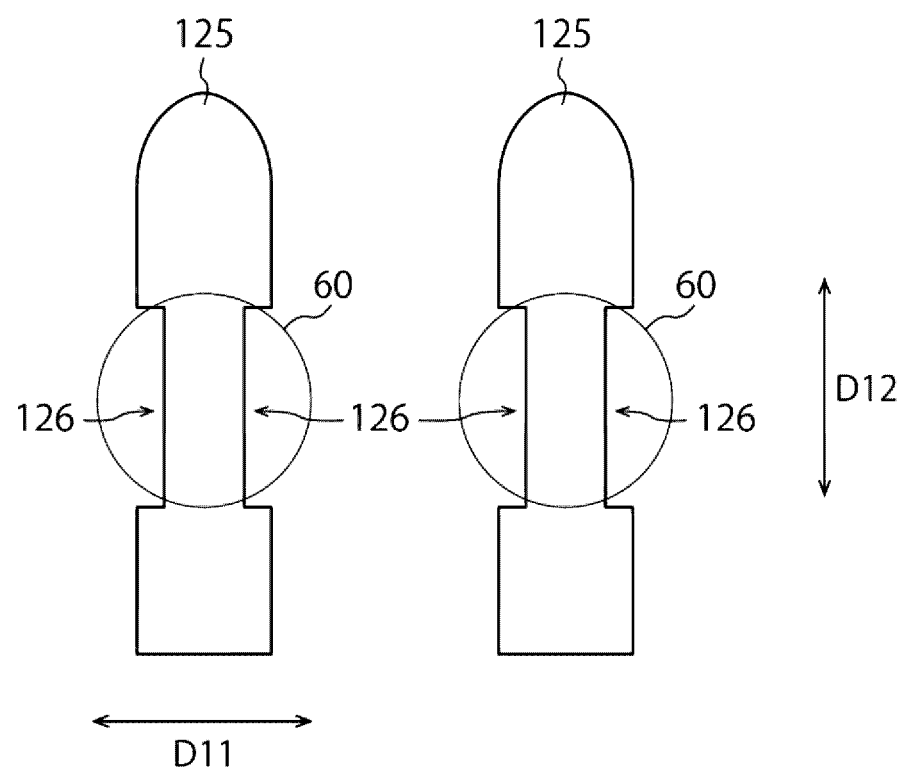
FIG. 16 is a schematic plan view illustrating a configuration of a connection portion between a substrate wiring and a metal bump according to the third embodiment.

FIG. 15 is a schematic sectional view illustrating a semiconductor chip according to a third embodiment. FIG. 16 is a schematic plan view illustrating a configuration of a connection portion between a substrate wiring and a metal bump according to the third embodiment. In the third embodiment, a semiconductor chip C1 may be connected onto a wiring substrate 120 by flip chip connection.

In the third embodiment, as illustrated in FIG. 15, substrate wirings 125 are mounted on the wiring substrate 120, and metal bumps 60 of the semiconductor chip C1 are connected onto the substrate wirings 125. As illustrated in FIG. 16, each side surface of the substrate wiring 125 has a recessed portion 126 at a connection portion between the substrate wiring 125 and the metal bump 60. In other words, as viewed from above the surface of the wiring substrate 120 (e.g., the plan view of FIG. 16), the width of a connection portion (e.g., the recessed portion 126 in FIG. 16) of the substrate wiring 125 with the metal bump 60 may be made smaller than the widths of other portions thereof, so that the connection portion is slimmed. Here, the wiring direction of adjacent substrate wirings 125 is referred to as a direction D12.

The metal bump 60 may be connected to the recessed portion 126 of the substrate wiring 125 by being reflowed by thermal compression bonding or ultrasonic waves. At this time, the metal bump 60 may flow in the direction D12 on the surface of the substrate wiring 125 and in the direction D1 along the side surface of the recessed portion 126. Thus, the metal bump 60 is not much protruded in a direction D11 in which substrate wirings 125 are adjacent to each other. Furthermore, an adhesive material such as non-conductive paste (NCP) or non-conductive film (NCF) may be provided between the wiring substrate 120 and the semiconductor chip C1.

In the above-described embodiments, stacking a plurality of semiconductor chips C1, C2, . . . , in layers may be referred to as stacking a semiconductor chip as a "first substrate" and a semiconductor chip as a "second substrate" in layers.

While certain embodiments have been described, these embodiments have been presented byway of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
   a first substrate having a first surface;
   a second substrate stacked on the first surface of the first substrate in a stacking direction, the second substrate having a second surface facing the first surface;
   a plurality of first terminals provided on the first surface of the first substrate;
   a plurality of second terminals provided on the second surface of the second substrate; and
   a plurality of metallic portions respectively provided between the plurality of first terminals and the plurality of second terminals,
   wherein, in a cross-section substantially perpendicular to the stacking direction, at least one of (i) each of the plurality of first terminals or (ii) each of the plurality of second terminals (a) includes a recessed portion in a first direction toward an adjacent first terminal or second terminal or (b) includes a projecting portion in a second direction intersecting with the first direction.

2. The semiconductor device according to claim 1, wherein each of the metallic portions is made from a material having a lower melting point than at least one of the first terminals or the second terminals, and
   wherein, in a cross-section substantially perpendicular to the stacking direction, a width of each of the metallic portions in the second direction is larger than a width of each of the metallic portions in the first direction.

3. The semiconductor device according to claim 1, wherein each of the metallic portions is made from a material having a lower melting point than at least one of the first terminals or the second terminals.

4. The semiconductor device according to claim 1, wherein, in a cross-section substantially perpendicular to the stacking direction, a width of each of the metallic portions in the second direction is larger than a width of each of the metallic portions in the first direction.

5. The semiconductor device according to claim 1, wherein, in a cross-section substantially perpendicular to the stacking direction, the second direction intersects with the first direction at an angle of about 45 degrees.

6. The semiconductor device according to claim 1, wherein, in a cross-section substantially perpendicular to the stacking direction, two of the first terminals most closely adjacent to each other face each other at a recessed portion of the two first terminals in the first direction, or two of the second terminals most closely adjacent to each other face each other at a recessed portion of the two second terminals in the first direction.

7. The semiconductor device according to claim 1, wherein, in a cross-section substantially perpendicular to the stacking direction, each of the first terminals or each of the second terminals has a shape of an approximate ellipse having a major axis in the second direction and having a minor axis in a direction substantially perpendicular to the second direction.

8. The semiconductor device according to claim 1, wherein, in a cross-section substantially perpendicular to the stacking direction, each of the first terminals has a shape of an approximate ellipse having a major axis in the second direction and having a minor axis in a direction substantially perpendicular to the second direction, and each of the second terminals has a shape of an approximate ellipse having a minor axis in the second direction and having a major axis in a direction substantially perpendicular to the second direction.

9. A semiconductor device comprising:
   a first substrate having a first surface;
   a second substrate stacked on the first surface of the first substrate in a stacking direction, the second substrate including a second surface facing the first surface;
   a plurality of first terminals provided on the first surface of the first substrate;
   a plurality of second terminals provided on the second surface of the second substrate; and
   a plurality of metallic portions respectively provided between the plurality of first terminals and the plurality of second terminals,
   wherein, in a cross-section substantially perpendicular to the stacking direction, one first terminal out of two first terminals most closely adjacent to each other includes a recessed portion in a first direction toward the other first terminal, and the other first terminal includes a projecting portion in the first direction.

10. The semiconductor device according to claim 9, wherein each of the metallic portions is made from a material having a lower melting point than at least one of the first terminals or the second terminals.

11. The semiconductor device according to claim 9, wherein the one first terminal includes a projecting portion in a second direction intersecting with the first direction.

12. The semiconductor device according to claim 11, wherein, in a cross-section substantially perpendicular to the stacking direction, the second direction intersects with the first direction at an angle of about 45 degrees.

13. The semiconductor device according to claim 11, wherein the other first terminal includes a recessed portion in the second direction.

* * * * *